United States Patent
Sankaranarayanan et al.

(10) Patent No.: US 10,755,776 B2
(45) Date of Patent: *Aug. 25, 2020

(54) ADAPTIVE READ THRESHOLD VOLTAGE TRACKING WITH GAP ESTIMATION BETWEEN ADJACENT READ THRESHOLD VOLTAGES

(71) Applicant: Seagate Technology LLC, Cupertino, CA (US)

(72) Inventors: Sundararajan Sankaranarayanan, Fremont, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/217,883

(22) Filed: Dec. 12, 2018

(65) Prior Publication Data
US 2019/0122726 A1    Apr. 25, 2019

Related U.S. Application Data

(63) Continuation of application No. 14/962,538, filed on Dec. 8, 2015, now Pat. No. 10,192,614, which is a
(Continued)

(51) Int. Cl.
*G11C 11/56* (2006.01)
*G11C 7/14* (2006.01)
*G11C 16/28* (2006.01)

(52) U.S. Cl.
CPC .......... *G11C 11/5642* (2013.01); *G11C 7/14* (2013.01); *G11C 16/28* (2013.01); *G11C 2211/5632* (2013.01); *G11C 2211/5634* (2013.01)

(58) Field of Classification Search
None
See application file for complete search history.

(56) References Cited

U.S. PATENT DOCUMENTS

| 8,453,022 B2 | 5/2013 | Katz |
| 8,711,619 B2 | 4/2014 | Patapoutian et al. |

(Continued)

OTHER PUBLICATIONS

Appendix to U.S. Patent Publication No. US 2013/0343131 A1 (Wu et al.), published Dec. 26, 2013.

*Primary Examiner* — J. H. Hur
(74) *Attorney, Agent, or Firm* — Taylor English Duma LLP

(57) ABSTRACT

Techniques are provided for adaptive read threshold voltage tracking with gap estimation between default read threshold voltages. A read threshold voltage for a memory is adjusted by estimating a gap between two adjacent default read threshold voltages using binary data from the memory, wherein the gap is estimated using statistical characteristics of at least one of two adjacent memory levels of the memory; computing an adjusted read threshold voltage associated with the two adjacent memory levels by using the statistical characteristics of the two adjacent memory levels and the gap; and updating the read threshold voltage with the adjusted read threshold voltage. Pages of the memory are optionally read at multiple read threshold offset locations to obtain disparity statistics, which can be used to estimate mean and/or standard deviation values for a given memory level. The gap is optionally estimated using the mean and/or standard deviation values.

15 Claims, 7 Drawing Sheets

Related U.S. Application Data continuation-in-part of application No. 14/928,181, filed on Oct. 30, 2015, now Pat. No. 10,347,343.

(56) References Cited

U.S. PATENT DOCUMENTS

| | | | |
|---|---|---|---|
| 8,724,381 B2 | 5/2014 | Burger et al. | |
| 10,192,614 B2* | 1/2019 | Sankaranarayanan | G11C 11/5642 |
| 10,347,343 B2* | 7/2019 | Sankaranarayanan | G11C 16/26 |
| 2009/0300465 A1 | 12/2009 | Wu et al. | |
| 2010/0008151 A1 | 1/2010 | Hwang | |
| 2010/0091535 A1 | 4/2010 | Sommer et al. | |
| 2010/0131809 A1 | 5/2010 | Katz | |
| 2010/0002506 A1 | 7/2010 | Cho et al. | |
| 2010/0214853 A1 | 8/2010 | Kang | |
| 2010/0296350 A1* | 11/2010 | Kim | G11C 11/5642 365/189.15 |
| 2011/0182119 A1 | 7/2011 | Strasser et al. | |
| 2012/0236651 A1 | 9/2012 | Hu et al. | |
| 2013/0094288 A1 | 4/2013 | Patapoutian et al. | |
| 2013/0094289 A1 | 4/2013 | Sridharan et al. | |
| 2013/0297986 A1 | 11/2013 | Cohen | |
| 2013/0343131 A1 | 12/2013 | Wu et al. | |
| 2014/0351668 A1 | 11/2014 | Zhang et al. | |
| 2015/0287453 A1 | 10/2015 | Wu et al. | |

* cited by examiner

ADAPTIVE READ THRESHOLD VOLTAGE TRACKING WITH GAP ESTIMATION BETWEEN ADJACENT READ THRESHOLD VOLTAGES

CROSS-REFERENCE TO RELATED APPLICATION

The present application is a continuation of U.S. patent application Ser. No. 14/962,538, filed Dec. 8, 2015, entitled "Adaptive Read Threshold Voltage Tracking with Gap Estimation Between Default Read Threshold Voltages," which is a continuation-in-part of U.S. patent application Ser. No. 14/928,181, filed Oct. 30, 2015, entitled "Adaptive Read Threshold Voltage Tracking With Separate Characterization on Each Side of Voltage Distribution About Distribution Mean," each incorporated by reference herein in its entirety.

FIELD

The field relates generally to solid state storage media and more particularly to read threshold voltages for such solid state storage media.

BACKGROUND

Solid state storage devices use analog memory cells to store data. Each memory cell stores a storage value, such as an electrical voltage. The storage value represents the information stored in the memory cell. Many solid state storage devices distinguish between different binary values that a memory cell may store based on a read voltage level of the memory cell. The range of possible storage values for each memory cell is typically divided into threshold regions, with each region separated by a read threshold voltage and corresponding to one or more data bit values. Ideally, all of the memory cells in a given solid state storage device have identical read threshold voltages for the logical bit values stored. In practice, however, the read threshold voltages differ across the cells in probability distributions along the read threshold voltage axis (e.g., "read threshold voltage distributions") that are similar to a Gaussian distribution.

In addition, solid state storage devices can shift over time. For example, memory cell leakage, memory cell damage and other disturbances to memory cells can alter the read voltage levels of the memory cells. Thus, the read threshold voltages can shift over time. The rate of leakage and other disturbances can also increase with age as memory cells are used over time. If the read voltage level of a memory cell shifts past a read threshold voltage, a data error occurs, as the value of the data read from the memory cell is different than the value of the data that was written to the memory cell.

A number of techniques have been proposed or suggested for adapting to the changes in the read threshold voltages to maintain a desired performance level. Existing adaptive tracking algorithms are designed to track variations in the solid state storage channel and consequently, to help maintain a set of updated channel parameters. The updated channel parameters are used, for example, to adjust read threshold voltages.

United States Published Patent Application No. 2013/0343131, filed Jun. 26, 2012, entitled "Optimization of Read Thresholds for Non-Volatile Memory," incorporated by reference herein in its entirety, discloses techniques for adapting read threshold voltages. While such existing adaptive tracking algorithms have helped to improve the performance of solid state storage devices, they suffer from one or more limitations, which if overcome, could further improve the reliability and performance of solid state storage devices. For example, the techniques described in United States Published Patent Application No. 2013/0343131 assume that the gaps between default read threshold voltages of solid state storage devices are known. Generally, gaps are constant values that ensure a common scale between various collected statistics. While some solid state storage vendors provide information on the gaps, others vendors do not provide such information.

Thus, a need exists for improved techniques for adapting read threshold voltages that estimate the gap between default read threshold voltages of solid state storage devices and thereby improve the decoding performance. A further need exists for techniques that separately characterize each side of a given distribution about the mean of the distribution to thereby compute read threshold voltages with improved robustness.

SUMMARY

Illustrative embodiments of the present invention provide techniques for adaptive read threshold voltage tracking with gap estimation between default read threshold voltages. In one embodiment, a method for adjusting a read threshold voltage for a memory comprises estimating a gap between two adjacent default read threshold voltages using binary data from the memory, wherein the gap is estimated using statistical characteristics of at least one of two adjacent memory levels of the memory; computing an adjusted read threshold voltage associated with the two adjacent memory levels by using the statistical characteristics of the two adjacent memory levels and the gap; and updating the read threshold voltage with the adjusted read threshold voltage.

In some embodiments, a further exemplary method comprises reading a plurality of pages of the memory at a plurality of read threshold offset locations to obtain disparity statistics of the memory; estimating at least one mean value and at least one standard deviation value of at least one region of a given memory level using the obtained disparity statistics; and estimating the gap between the two adjacent default read threshold voltages using at least one of the at least one mean value and the at least one standard deviation value of the at least one region of the given memory level.

The disclosed techniques, in one or more embodiments, for adapting read threshold voltages with gap estimation between default read threshold voltages overcome one or more of the problems associated with the conventional techniques described previously, depending on characteristics of the flash memory device. These and other features and advantages of the present invention will become more readily apparent from the accompanying drawings and the following detailed description.

DETAILED DESCRIPTION

Figure 1:
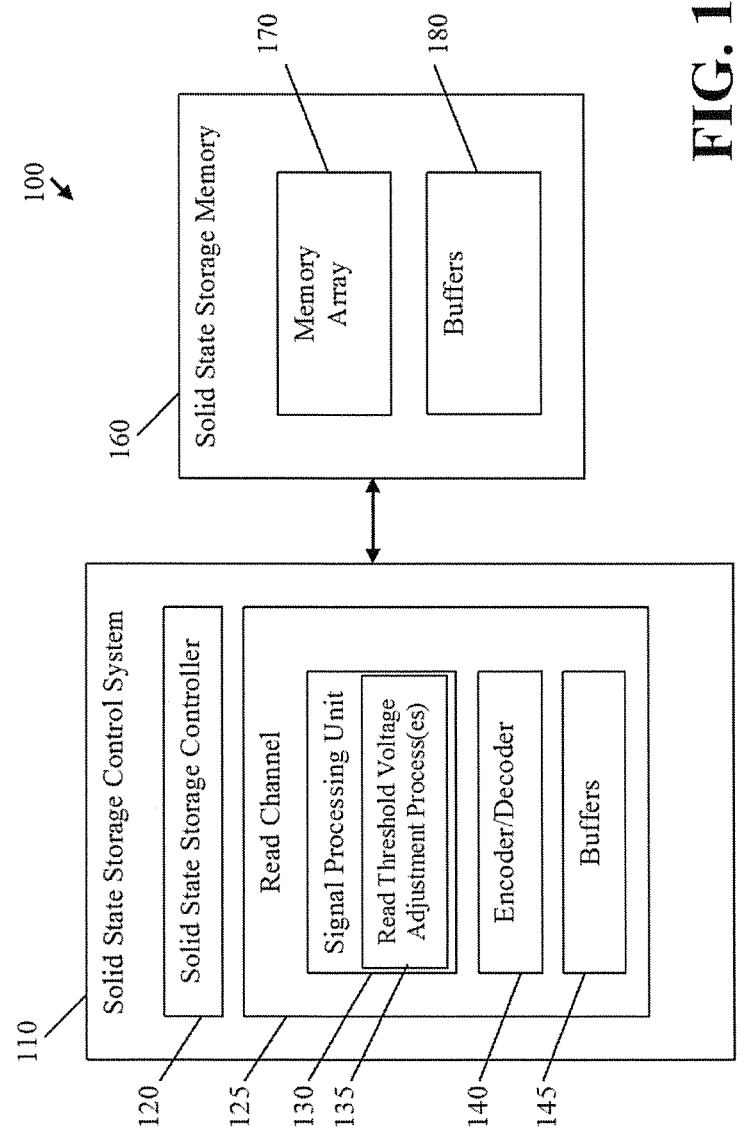
FIG. 1 illustrates a solid state storage memory system incorporating controller-based read threshold voltage adjustment techniques in accordance with at least one embodiment of the invention.

Illustrative embodiments of the present invention will be described herein with reference to exemplary solid state storage devices and associated controllers, read channels and other processing devices. It is to be appreciated, however, that the invention is not restricted to use with the particular illustrative system and device configurations shown. Accordingly, the term "solid state storage device" as used herein is intended to be broadly construed, so as to encompass, for example, flash memory devices.

As noted above, the read threshold voltages differ across the cells in probability distributions along the read threshold voltage axis (e.g., "read threshold voltage distributions") that are similar to a Gaussian distribution. The Gaussian-like distribution can be characterized by a mean and a standard deviation (e.g., a variance) in a well-known manner.

As will be described, the present invention, in one or more illustrative embodiments, provides methods and apparatus for separately characterizing each side of a given distribution about the mean of the distribution to thereby compute read threshold voltages with improved robustness. Separate characterization is necessitated by the fact that voltage distributions after endurance and/or retention effects are not symmetric (e.g., each side of a distribution are different from one another).

According to one aspect of the invention, a memory level is characterized independently on the two sides (often referred to as "tails") about a mean of the statistical distribution of the memory level. In one embodiment, two standard deviations and at least one mean are used to characterize each statistical distribution. This feature will improve performance because distributions observed from collected solid state storage data show asymmetry about its mean. Among other benefits, independently characterizing a memory level on the two sides about the mean provide a more accurate estimation of the crossover point where the distributions for two adjacent memory levels cross.

In this manner, improved log-likelihood ratio (LLR) assignments can be computed for a soft low-density parity-check (LDPC) decoder in at least one embodiment. As before, LLR assignments can stay true to the asymmetry in the underlying distribution. In addition, by independently characterizing a memory level on the two sides about the mean, read threshold voltages can be computed with improved robustness.

According to a further aspect of the invention, in one or more illustrative embodiments, gaps between default read threshold voltages are estimated. Thus, methods and apparatus are provided in one or more embodiments for adapting read threshold voltages by estimating the gap between two adjacent default read threshold voltages of solid state storage devices. The gap between default read threshold voltages cannot be directly computed in certain flash families due to a lack of access to actual voltages. Available read outs are often offset values normalized within a read window.

At least one embodiment provides flexibility to control the quality of gap estimates. High quality estimates will lead to a reduced rate of estimation success. Among other potential benefits, gaps between default read threshold voltages estimated in accordance with aspects of the invention allow improved read threshold voltages and LLR assignments to be computed.

FIG. 1 illustrates a solid state storage memory system 100 incorporating controller-based read threshold voltage adjustment techniques in accordance with one embodiment of the invention. As shown in FIG. 1, a solid state storage memory system 100 comprises a solid state storage control system 110 and a solid state storage memory block 160, connected by an interface. The solid state storage control system 110 comprises a solid state storage controller 120 and a read channel 125, typically on one or more integrated circuits.

It is noted that the term "read channel" can encompass the write channel as well. The read channel 125 comprises a signal processing unit 130, an encoder/decoder block 140 and one or more buffers 145. In an alternative embodiment, the encoder/decoder block 140 and some buffers 145 may be implemented inside the solid state storage controller 120. The encoder/decoder block 140 and buffers 145 may be implemented, for example, using well-known commercially available techniques and/or products.

The signal processing unit 130 comprises one or more processors that implement one or more read threshold voltage adjustment processes 135, discussed further below, for example, in conjunction with FIGS. 3 and 4 and the section entitled "Estimating Read Thresholds, Gap Values (when needed), Mean and Standard Deviation." The solid state storage memory block 160 comprises a memory array 170 and one or more buffers 180 that may each be implemented using well-known commercially available techniques and/or products.

Preliminaries

Single-level cell (SLC) solid state storage devices, for example, store one bit per memory cell (or two possible memory states). Multi-level cell (MLC) solid state storage devices, on the other hand, store two or more bits per memory cell (e.g., each cell has four or more programmable states). For a more detailed discussion of MLC solid state storage devices, see, for example, U.S. patent application Ser. No. 12/920,407, filed Aug. 31, 2011, entitled "Methods and Apparatus for Storing Data in a Multi-Level Cell Flash Memory Device with Cross-Page Sectors, Multi-Page Coding and Per-Page Coding," now U.S. Pat. No. 8,724,381, incorporated by reference herein in its entirety.

Assume that a page of user data is sufficiently scrambled to obtain a sequence with, roughly, an equal number of binary ones and binary zeroes. In an application that cannot guarantee this condition, a fixed (and known a priori) number of binary ones and zeroes can be employed, as would be apparent to a person of ordinary skill in the art.

Disparity of a bit sequence is typically defined as a ratio of the number of binary ones to the length of the sequence. The number of binary ones in a bit sequence is often referred to as the weight of the sequence. In an attempt to describe a disparity metric in the context of soft read retries, consider an SLC. The SLC assumption is for the sake of convenience and the treatment easily extends to MLCs, as would be apparent to a person of ordinary skill in the art.

An SLC stores a single bit $x=\{0,1\}$ in the form of electric charges and the cell voltage, say y, can be deduced with multiple read operations, often referred to as soft read operations. In one model of a solid state storage device channel, y conditioned on $x=1(0)$ is distributed normally with a mean $\mu_1(\mu_2)$ and a standard deviation $\sigma_1(\sigma_2)$. It is noted that for a soft voltage y, soft read operations do not provide an actual voltage, but rather, a voltage range with a maximum voltage and a minimum voltage. With a single read operation at $V_{REF}$ (e.g., a hard read operation), two regions (or voltage ranges) are created, as follows:

$y \in (-\infty, V_{REF})$, or $y \in (V_{REF}, \infty)$.

With two read operations at voltages $V_1$ and $V_2$, three regions are created, as follows:

$y \in (-\infty, V_1]$, or $y \in (V_1, V_2]$, or $y \in (V_2, \infty)$.

In general, the number of regions is one more than the total number of read operations.

Figure 2:
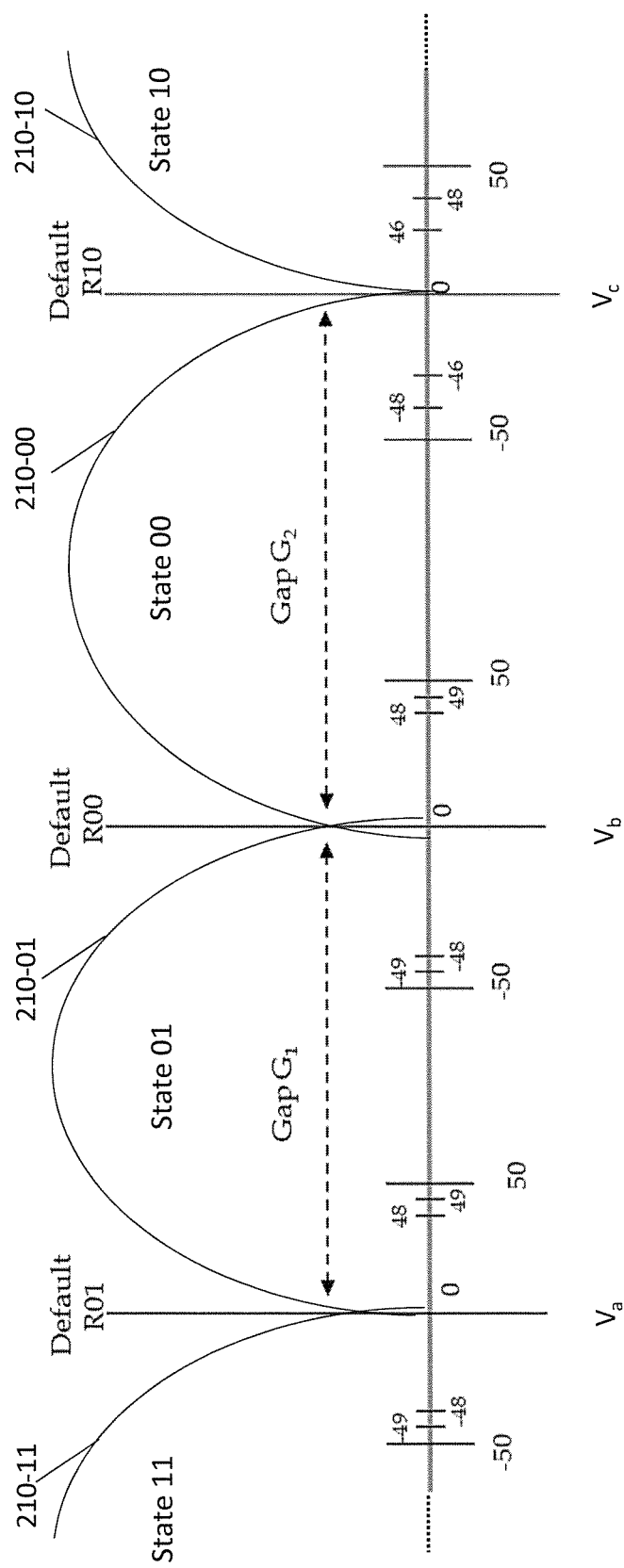
FIG. 2 illustrates three read threshold voltages for an MLC solid state storage device in accordance with at least one embodiment of the invention.

FIG. 2 illustrates three read threshold voltages for an MLC solid state storage device. The read threshold voltage axis is drawn with increasing positive voltage to the right. An absolute scale is not shown, and no reference points are identified, such that the figure applies more generally to a larger population of non-volatile memories.

In the embodiment shown in FIG. 2, four corresponding regions (or states) are created by three default (e.g., nominal) read threshold voltages R01, R00 and R10 (also shown as $V_a$, $V_b$, and $V_c$, respectively), for a Gray code mapping. Generally, an upper page is read by reading read threshold voltages R01 and R10 and a lower page is read by reading read threshold voltage R00.

For the MLC media, the left most state 11 in FIG. 2 (to the left of read threshold voltage R01) is the erase state and a NAND cell in the erase state typically carries a negative voltage. Three other states 01, 00, 10, respectively, to the right of the left most state in FIG. 2 may span voltage range from 0 V to (roughly) 5 V. The voltage range may change significantly with different manufacturers. Thus, the above mentioned range is for illustrative purpose only, as would be apparent to a person of ordinary skill in the art.

As shown in FIG. 2, the default read threshold voltage Default R01 is used to differentiate between State 11 and State 01. Often, Default R01 is referenced as Offset 001 (or simply as Offset 1 provided that the context is clear), and manufacturers allow for a limited sweep window about Default R01. In the embodiment shown in FIG. 2, R01 can be assigned one of 101 possible offset values, 50 offset values each to the right and left of Default R01.

The default read threshold voltage Default R00 is the default read threshold voltage about State 01 and State 00. Often, Default R00 is referenced as Offset 000 (or simply as Offset 0 provided that the context is clear) and manufacturers allow for a limited sweep window about Default R00. In the embodiment shown in FIG. 2, R00 can be assigned one of 101 possible offset values, 50 offset values each to the right and left of Default R00, in a similar manner to R01.

The default read threshold voltage Default R10 is the default read threshold voltage about State 00 and State 10. Often, Default R10 is referenced as Offset 010 (or simply as Offset 2 provided that the context is clear) and manufacturers allow for a limited sweep window about Default R10. In the embodiment shown in FIG. 2, R10 can be assigned one of 101 possible offset values, 50 offset values each to the right and left of Default R10, in a similar manner to R01 and R00.

It is noted that references to offsets should not be construed as a limitation of the present invention in its applicability to NAND solid state storage types that choose to use actual voltage values instead. The invention is not limited by units of the voltage sweep steps, as would be apparent to a person of ordinary skill in the art. It is noted that the numbers appearing in FIG. 2 and the related discussion, such as offsets 50 and 101, are used for illustrative purposes only and should not be construed as a limitation of the present invention.

FIG. 2 also illustrates the distributions 210-11, 210-01, 210-00 and 210-10, respectively, associated with each state 11, 01, 00, 10. Generally, each distribution 210 can typically be characterized by one mean value ($\sigma$) and one standard deviation value ($\mu$) (not shown in FIG. 2). It is noted that mean values and standard deviation values corresponding to x=1 and x=0 are dependent on the quality of the channel and change with channel disturbances such as program/erase cycle (PEC), data retention and read disturbances. A substantially optimal hard read, in terms of minimizing the bit-error rate, is placed at the intersection of the two adjacent distributions 210 typically defined by their respective mean value and standard deviation value. As discussed above, aspects of the present invention provide improved techniques for characterizing the distributions 210.

FIG. 2 also illustrates a first Gap G1 that is defined as the distance (measured, for example, in Volts or offset steps) between Default R01 and Default R00. Similarly, a second Gap G2 is defined as the distance (measured, for example, in Volts or offset steps) between Default R00 and Default R10. As indicated above, the adaptive tracking techniques described in United States Published Patent Application No. 2013/0343131, incorporated by reference herein in its entirety, assume knowledge of these gaps G1 and G2. One or more aspects of the present invention provide adaptive tracking algorithms that include a gap estimation portion.

The adaptive tracking algorithms disclosed in United States Published Patent Application No. 2013/0343131 use disparity values (e.g., fraction of ones output from a page read) observed from multiple reads to estimate mean values and standard deviation values of the underlying cell voltage distribution 210. The disclosed adaptive tracking algorithm assumes that the underlying cell voltage distribution 210 is Gaussian and adaptively tracks for the mean value and standard deviation value of the distribution 210. In addition, the disclosed adaptive tracking algorithms can compute substantially optimal read threshold voltages R01, R00, and R10.

As discussed further below, the adaptive tracking algorithms disclosed herein can estimate gaps G1 and G2 if they are unknown and one or more embodiments employ two separate runs of the tracking algorithm:

1. A first run is aimed at estimating gaps G1 and G2. Typically, gaps G1 and G2 are constant across all operating conditions of the solid state storage device. Hence, the first run will track a sufficient number of pages (lower and upper) to obtain an estimate of gaps G1 and G2.

2. A second run is aimed at estimating mean values, standard deviation values and substantially optimal read threshold voltages. Gaps G1 and G2 that were estimated in the first run are applied as inputs to the second run.

In one or more embodiments, the adaptive tracking algorithms disclosed herein are offline mechanisms designed to be performed, for example, periodically or upon request.

Estimating Read Thresholds, Gap Values (When Needed), Mean and Standard Deviation For one of the states 11, 01, 00, 10 of a solid state storage device, such as an SLC, an MLC, a TLC (tri-level cell) or a QLC (quad-level cell) device, the standard Q-function can be expressed as follows:

$$\int_{\frac{(\mu - \theta_i)}{\sigma}}^{\infty} \frac{1}{\sqrt{2\pi}} e^{-\frac{x^2}{2}} dx = p_i, \ 1 \leq i \leq t. \tag{1}$$

The mean (μ) and standard-deviation (σ) are the parameters of the Gaussian distribution and x is a variable. In addition, $\Theta_i$ is the position of the i-th read and there are a total of t reads (e.g., in an offset range of −50 to +50 for the embodiment discussed further below in conjunction with FIG. 3). For example, if the read operation is currently at an offset of −5, equation (1) indicates the area to the left of the vertical line associated with an offset of −5. $p_i$ is a quantity that is measured from the solid state storage device with a read operation and this quantity is related to the number of ones in the page (often referred to as the observed disparity of the solid state storage device). Generally, $\Theta_i$ and $p_i$ are known and μ and σ are the values to be obtained.

Using a standard Q-function or a look-up-table (LUT) (having an index $p_i$), equation (1) can be transformed into the following expression (often referred to as an inverse Q-function):

$$\frac{(\mu - \theta_i)}{\sigma} = -Q^{-1}(p_i) = a_i, 1 \le i \le t, \quad (2)$$

where $a_i$ is obtained from a Q-table look-up that can be efficiently implemented by a binary tree search.

With t observations, a cost function can be employed to estimate the desired mean and standard deviation by minimizing the cost function. In one implementation, the cost function may be expressed as follows, where w(s) are known weights that may or may not depend on a(s).

$$f(\mu, \sigma) = \sum_{i=1}^{t} w_i(\mu - \theta_i - a_i\sigma)^2, \quad (3)$$

where $w_i$ is a known weight factor.

Generally, at least two points (e.g., observations) are needed to estimate the mean and standard deviation of a given distribution. If there are more than two observations, the multiple observations are optionally combined to obtain a single estimate of the mean and standard deviation.

Due to the limited range of the sweep window, $\Theta_i$ can be positioned on the right or left tail of a given distribution 210. For example, for Level-1 of an MLC, the left tail of the distribution is visible using a $V_a$ sweep and the right tail of the distribution is visible using a $V_b$ sweep. Let $t_l$ and $t_r$ sweeps (observations) correspond to $V_a$ and $V_b$ sweeps, respectively, (e.g., number of left (l) and number of right (r) reads) such that $t=t_l+t_r$. In addition, let G be the gap between $V_a$ and $V_b$. In this manner, in at least one embodiment, the gap G ensures that the left and right tails of the distribution are on the same scale and can be combined. For example, offset 0 associated with default read threshold voltage R00 in FIG. 2 can be considered to be gap G1 plus step 0. In this case, the cost function of equation (3) can be separated for reads of the left (l) and right (r) tails, as follows:

$$\frac{(\mu - \theta_i)}{\sigma} = Q^{-1}(p_i) = a_i, 1 \le i \le t_l, \quad (4)$$

$$\frac{(\mu - (G + \theta_i))}{\sigma} = Q^{-1}(p_i) = a_i, 1 + t_l \le i \le t_r, \quad (5)$$

where l is the number of reads of the left tail and r is the number of reads of the right tail. The gap G is included in equations (4) and (5) as a mechanism for relating $V_a$ offset shifts to $V_b$ offset shifts (as shown in FIG. 2).

Typically, the distributions corresponding to a particular memory level are sensed from two directions for an MLC device or a TLC device. In other words, the right tail is observed by sweeping one read threshold voltage and the left tail is observed by sweeping another read threshold voltage. The statistics obtained by sweeping the two tails can be treated in three ways, each discussed further below:

Case I: Characterize right and left tails separately, according to one aspect of the invention, without requiring the same mean. In this case, gap values are not required.

Case II: Combine left and right tail statistics and use the known gap values to estimate the mean and standard deviation of the distribution.

Case III: Characterize right and left tails separately, according to one aspect of the invention, but with the same mean. Gap value(s) may be known in advance. If, however, the gap values are not already known, then they must first be estimated.

Case I: Gap Value(s) Not Required

As noted above, according to one aspect of the invention, the right and left tails can be characterized separately, without the restriction of having the same mean. In this case, the right and left tails of the distribution are characterized independently of one another and the gap values are not required. A first mean and standard deviation pair corresponds to the left tail and a second mean and standard deviation pair corresponds to the right tail. The cost functions are set up using equations (4) and (5): the equation (4) instance of the cost function has $t_l$ reads (corresponding to the left tail) and the equation (5) instance of the cost function has $t_r$ reads (corresponding to the right tail). The gap, G, in equation (5) can be set to zero.

Case II: Use Gap Value(s) When Gap Value(s) are Known

As noted above, the right and left tail statistics can be combined and the known gap values are used to estimate the mean and standard deviation of the distribution.

In one embodiment, the following set of equations are used to setup the cost function for minimization:

$$\frac{(\mu - \theta_i)}{\sigma} = Q^{-1}(p_i) = a_i, 1 \le i \le t_l; \quad (6)$$

$$\frac{(\mu - (G + \theta_i))}{\sigma} = Q^{-1}(p_i) = a_i, 1 + t_l \le i \le t_r; \quad (7)$$

$$f(\mu, \sigma) = \sum_{i=1}^{t} w_i(\mu - \theta_i - a_i\sigma)^2. \quad (8)$$

Equations (6) and (7) are the cost functions for the left and right tails, respectively, using the gap value G, and equation (8) is used to estimate a single pair of mean and standard deviation values.

Case IIIa: Separately Characterize Left and Right Tails When Gap Values are Known In at least one embodiment, the left tail is parameterized with a standard deviation that is different than the standard deviation value of the right tail. The two tails, however, are linked together with a single mean parameter (e.g., two standard deviation values, $\sigma_l$ and $\sigma_r$, for left and right tails, respectively, and one mean value (μ, indicating a same center) are obtained):

$$\frac{(\mu - \theta_i)}{\sigma_l} = Q^{-1}(p_i) = a_i, 1 \le i \le t_l; \quad (9)$$

$$\frac{(\mu - (G + \theta_i))}{\sigma_r} = Q^{-1}(p_i) = a_i, 1 + t_l \le i \le t_r; \quad (10)$$

-continued $$f(\mu, \sigma_l, \sigma_r) = \sum_{i=1}^{t_l} w_i(\mu - \theta_i - a_i\sigma_l)^2 + \sum_{i=1}^{t_r} w_i(\mu - \theta_i - a_i\sigma_r)^2. \quad (11)$$

Equations (9) and (10) are the cost functions for the left and right tails, respectively, and equation (11) is used to estimate two standard deviation values and one mean value.

Case IIIb: Separately Characterize Tails When Gap Value(s) Require Estimation

As noted above, in some cases, one or more gap values are required but may be unknown. The gap G can be initially estimated using equations based on statistics from the left tail only (for example) to estimate the mean and standard deviation, as follows:

$$\frac{(\mu_l - \theta_i)}{\sigma_l} = Q^{-1}(p_i) = a_i, \ 1 \leq i \leq t_l; \quad (12)$$

$$f(\mu_l, \sigma_l) = \sum_{i=1}^{t_l} w_i(\mu_l - \theta_i - a_i\sigma_l)^2. \quad (13)$$

Equation (12) evaluates the statistics of the left tail and equation (13) is used to estimate a mean value and a standard deviation value for the left tail.

Thereafter, equations are set up based on statistics from the right tail only (for example) to estimate the mean and standard deviation values, as follows:

$$\frac{(\mu_r - \theta_i)}{\sigma_r} = Q^{-1}(p_i) = a_i, \ 1 \leq i \leq t_r; \quad (14)$$

$$f(\mu_r, \sigma_r) = \sum_{i=1}^{t_r} w_i(\mu_r - \theta_i - a_i\sigma_r)^2. \quad (15)$$

Equation (14) evaluates the statistics of the right tail and equation (15) is used to estimate a mean value and a standard deviation value for the right tail.

Since the same distribution is measured from the left side and then from the right side (for example), the mean estimated from the left tail statistics should be equal to the mean estimated from the right tail statistics. Therefore, the gap G can be expressed as the difference between the left and right mean values, as follows:

$$G = \mu^L - \mu^R. \quad (16)$$

Figure 3:
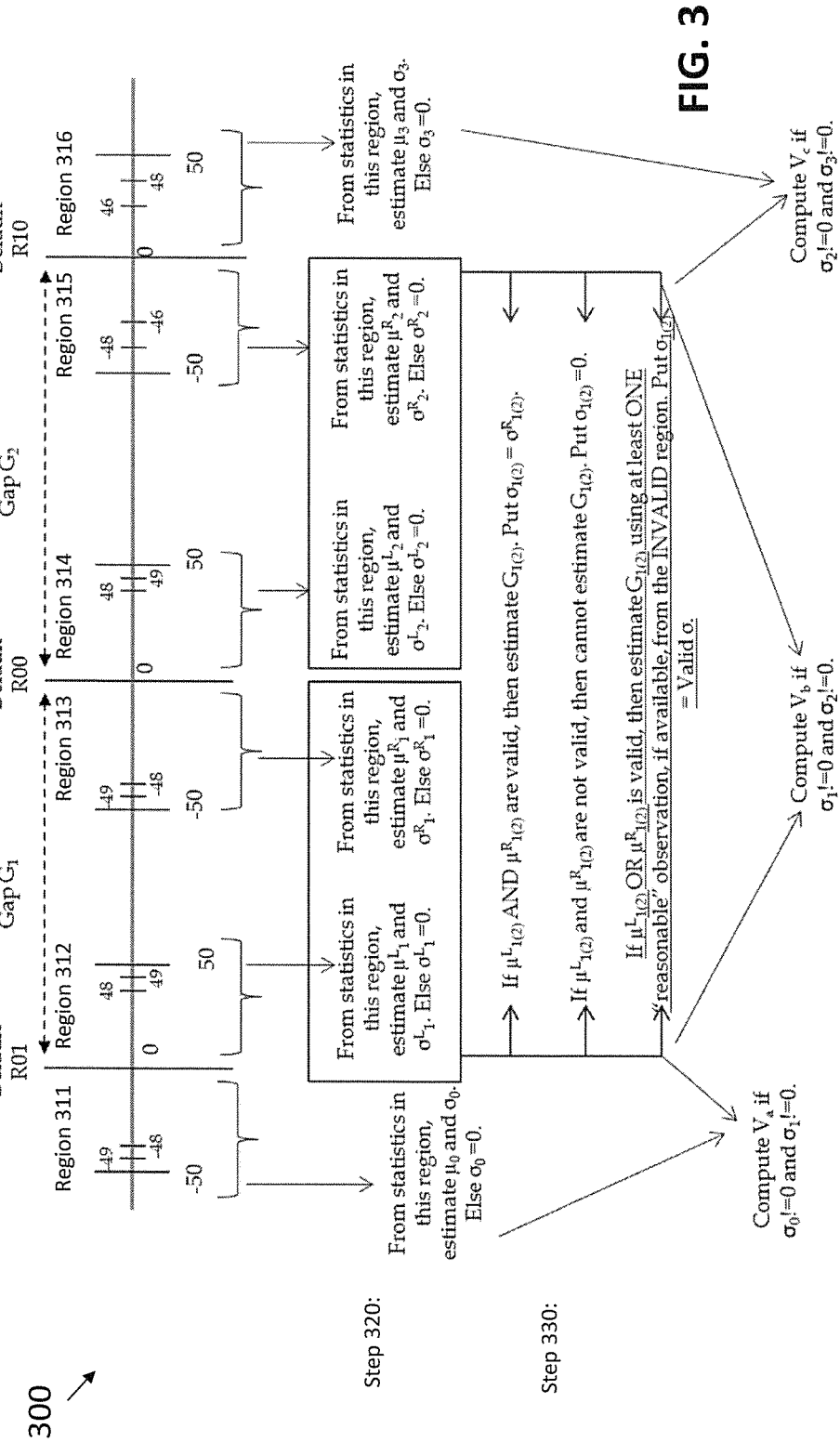
FIGS. 3 through 6 are flow charts illustrating implementations of read threshold voltage adjustment processes according to one or more embodiments of the invention.

FIG. 3 is a flow chart illustrating an implementation of a read threshold voltage adjustment process 300 according to one embodiment of the invention. The read threshold voltage adjustment process 300 employs six regions 311-316:

1. Region 311 to the left of Default R01 corresponds to the right tail of the distribution of State 11.

2. Region 312 to the right of Default R01 corresponds to the left tail of the distribution of State 01. The mean value and standard deviation estimate from the left tail statistics are referenced with a superscript L, for left tail, and a subscript 1.

3. Region 313 to the left of Default R00 corresponds to the right tail of the distribution of State 01. The mean value and standard deviation estimate from the right tail statistics are referenced with a superscript R, for right tail, and a subscript 1.

4. Region 314 to the right of Default R00 corresponds to the left tail of the distribution of State 00. The mean value and standard deviation estimate from the left tail statistics are referenced with a superscript L and a subscript 2.

5. Region 315 to the left of Default R10 corresponds to the right tail of the distribution of State 00. The mean value and standard deviation estimate from the right tail statistics are referenced with a superscript R and a subscript 2.

6. Region 316 to the right of Default R10 corresponds to the left tail of the distribution of State 10.

The read threshold voltage adjustment process 300 initially collects disparity statistics by reading pages (lower and upper pages) at various offset locations. For example, for lower pages, disparity statistic are collected as follows in one embodiment:

Select a page and read its lower page at a chosen offset value (e.g., R00=valid offset). Record the number of ones or disparity count of the page read. For the running example discussed above in conjunction with FIG. 2, the lower page is read at all 101 read threshold voltages/offsets and 101 corresponding disparity counts are recorded.

Thereafter, the read threshold voltage adjustment process 300 collects disparity statistics by reading the upper page, in a similar manner as the lower page.

As shown in FIG. 3, the read threshold voltage adjustment process 300 estimates the mean value and standard deviation value of the tail for each region 311-316 during step 320 using the disparity statistics collected for the respective region. For instance, using statistics collected from Region 312, $(\mu^L_1, \sigma^L_1)$ are estimated, for example, as described in United States Published Patent Application No. 2013/0343131. Similarly, $(\mu^R_1, \sigma^R_1)$ are estimated using statistics collected from Region 313.

As shown in FIG. 3, the read threshold voltage adjustment process 300 estimates the default gaps during step 330. FIG. 3 illustrates the following three flow possibilities in step 330:

Flow Possibility I: When disparity statistics are valid (e.g., sufficiently good), $(\mu^L_{1(2)}, \sigma^L_{1(2)})$ and $(\mu^R_{1(2)}, \sigma^R_{1(2)})$ are estimated. In this case, a robust estimate is obtained of gaps G1 and G2, as discussed further below in a section entitled "Gap Estimation."

Flow Possibility II: It is possible, however, that $(\mu^L_{1(2)}, \sigma^L_{1(2)})$ or $(\mu^R_{1(2)}, \sigma^R_{1(2)})$ cannot be estimated (referred to as Invalid in FIG. 3) due to a lack of sufficient statistics. In this case, gaps G1 and G2 can be estimated if some other condition is satisfied, as discussed further below in conjunction with FIG. 4.

Flow Possibility III: If $(\mu^L_{1(2)}, \sigma^L_{1(2)})$ and $(\mu^R_{1(2)}, \sigma^R_{1(2)})$ cannot be estimated or both are invalid, then gaps G1 (or G2) cannot be estimated. If gaps G1 or G2 cannot be estimated, the read threshold voltage adjustment process 300 can be re-executed with a different set of pages.

Gap Estimation

For Flow Possibility I, $(\mu^L_1, \sigma^L_1)$ and $(\mu^R_1, \sigma^R_1)$ are obtained and valid. In this case, gap G1 is computed using equation (16) as the difference between the left and right mean values $$(\mu^L - \mu^R),$$

where $\mu^L$ and $\mu^R$ are computed as discussed above in the section entitled "Separately Characterize Tails When Gap Value(s) Require Estimation."

Gap G2 is computed in a similar manner.

As noted above, for Flow Possibility II, it is possible that $(\mu^L_{1(2)}, \sigma^L_{1(2)})$ or $(\mu^R_{1(2)}, \sigma^R_{1(2)})$ cannot be estimated (referred to as Invalid in FIG. 3) due to a lack of sufficient statistics. In this case, gaps G1 and G2 are estimated if some other condition is satisfied.

Figure 4:
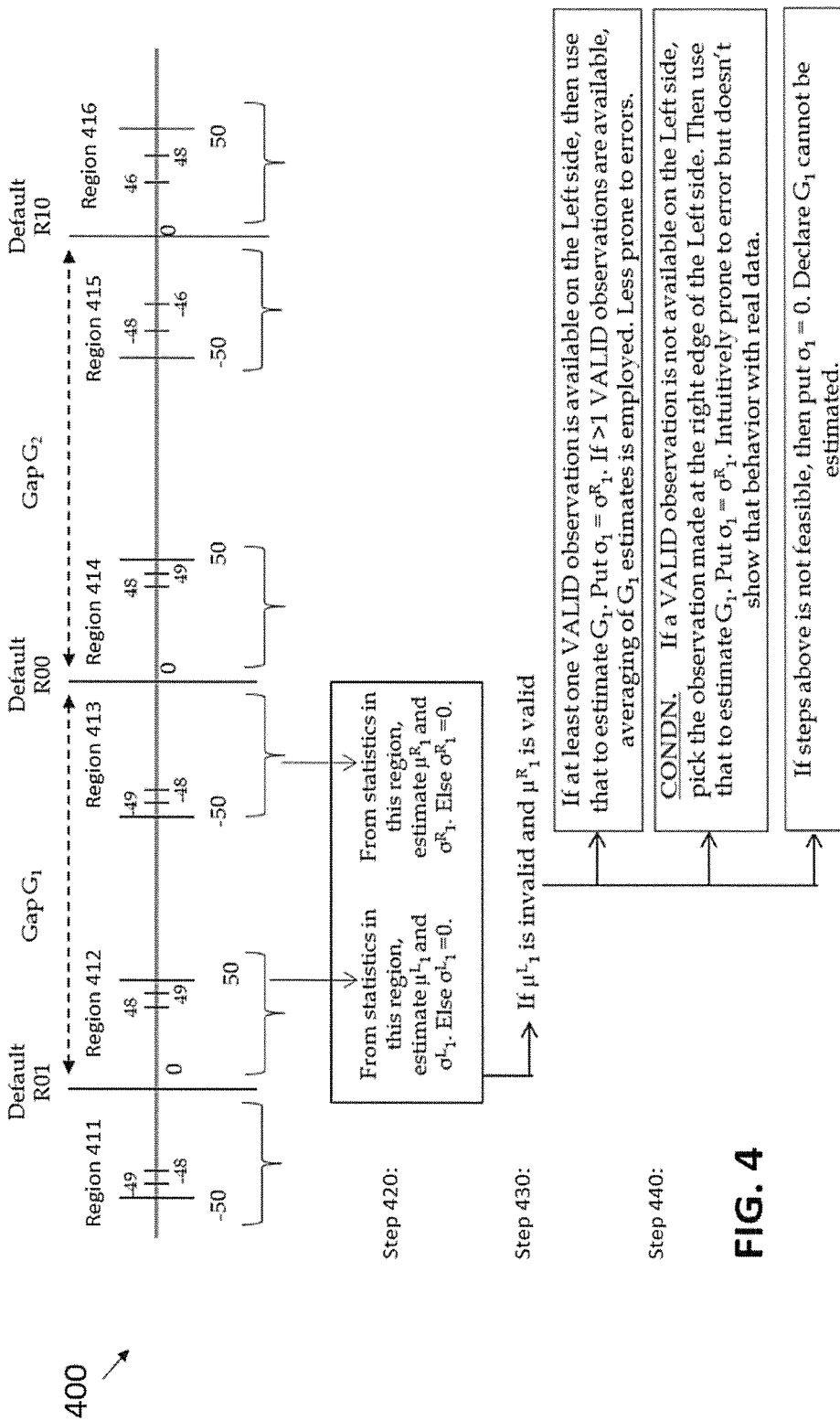

FIG. 4 is a flow chart illustrating an implementation of a read threshold voltage adjustment process 400 employed for Flow Possibility II. The read threshold voltage adjustment process 400 employs six regions 411-416, in a similar manner as the regions 311-316 of FIG. 3. The embodiment of FIG. 4 assumes that the right statistics ($\mu^R_{1(2)}$, $\sigma^R_{1(2)}$) are valid and that the left statistics ($\mu^L_{1(2)}$, $\sigma^L_{1(2)}$) are invalid.

The read threshold voltage adjustment process 400 estimates the mean value and standard deviation value associated with regions 412 and 413 during step 420. A test is performed during step 430 to evaluate the validity of the statistics. If it is determined during step 430 that, for example, $\mu^L_1$ is invalid and $\mu^R_1$ is valid, then the read threshold voltage adjustment process 400 processes one of three possible flow branches in step 440.

The first two flow branches in step 440 refer to "valid observation," defined as follows in at least one embodiment: Several disparity statistic observations are made in Region 312 of FIG. 3 during several soft reads. Due to noise in the system (such as noise from solid state storage media and electronics), not all observations are reliable and a pruning technique can optionally be employed to choose a subset of reliable observations from the lot. A pruned set of observations is referred to as valid observations. Typically, cardinality of the set of valid observations is small and may be as small as one or zero.

During the first flow branch of step 440, if there is at least one valid observation for the left tail, then the one available valid observation for the left tail is used to estimate the gap $G_1$. The standard deviation value is assigned as follows:

$$\sigma_1 = \sigma_1^R.$$

In addition, the gap is estimated as follows:

$$\delta_{VALID}(x^L) = \frac{1}{\sqrt{2\pi} \sigma_1^R} e^{\left(-\frac{(x^R - \mu_1^R)}{\sqrt{2} \sigma_1^R}\right)^2},$$

solve for $x^R$.

$$G_1 = x^L - x^R$$

where x is the memory level.

If more than one valid observations are available for the first flow branch, the various resulting estimates of the gap $G_1$ can be averaged. Thus, the read threshold voltage adjustment process 400 in FIG. 4 employs an averaging technique when the cardinality of the set of valid observations is greater than one. It is possible, however, to design other robust variations (using well-known mathematical techniques) to this averaging technique.

If there is not a valid observation on the left side, an observation can be selected instead in the second flow branch of step 440. This approach, however, may be more prone to error than working with valid observations. Thus, during the second flow branch of step 440, pursuant to a predefined condition, if a valid observation is not available on the left side, for example, then the observation made at the right edge of the left side is selected. Thereafter, the selected observation is used to estimate the gap $G_1$. The standard deviation value is assigned as follows:

$$\sigma_1 = \sigma_1^R.$$

During the third flow branch of step 440, when the first two flow branches are not possible, then the standard deviation value is assigned as follows, and it is declared that the gap $G_1$ cannot be estimated from the data for the current page:

$$\sigma_1 = 0.$$

Adjusted Read Threshold Voltages

If the gaps G1 and G2 were previously known, or have been estimated using the techniques described herein, then the mean values, standard deviation values, and adjusted (e.g., optimal) read threshold voltages can be estimated as well. Once the distributions 210 are characterized in accordance with the techniques described herein, a given read threshold voltage R01, R00, R10 is obtained from the crossover point where the distributions for two adjacent levels 11, 01, 00, 10 cross.

Figure 5:
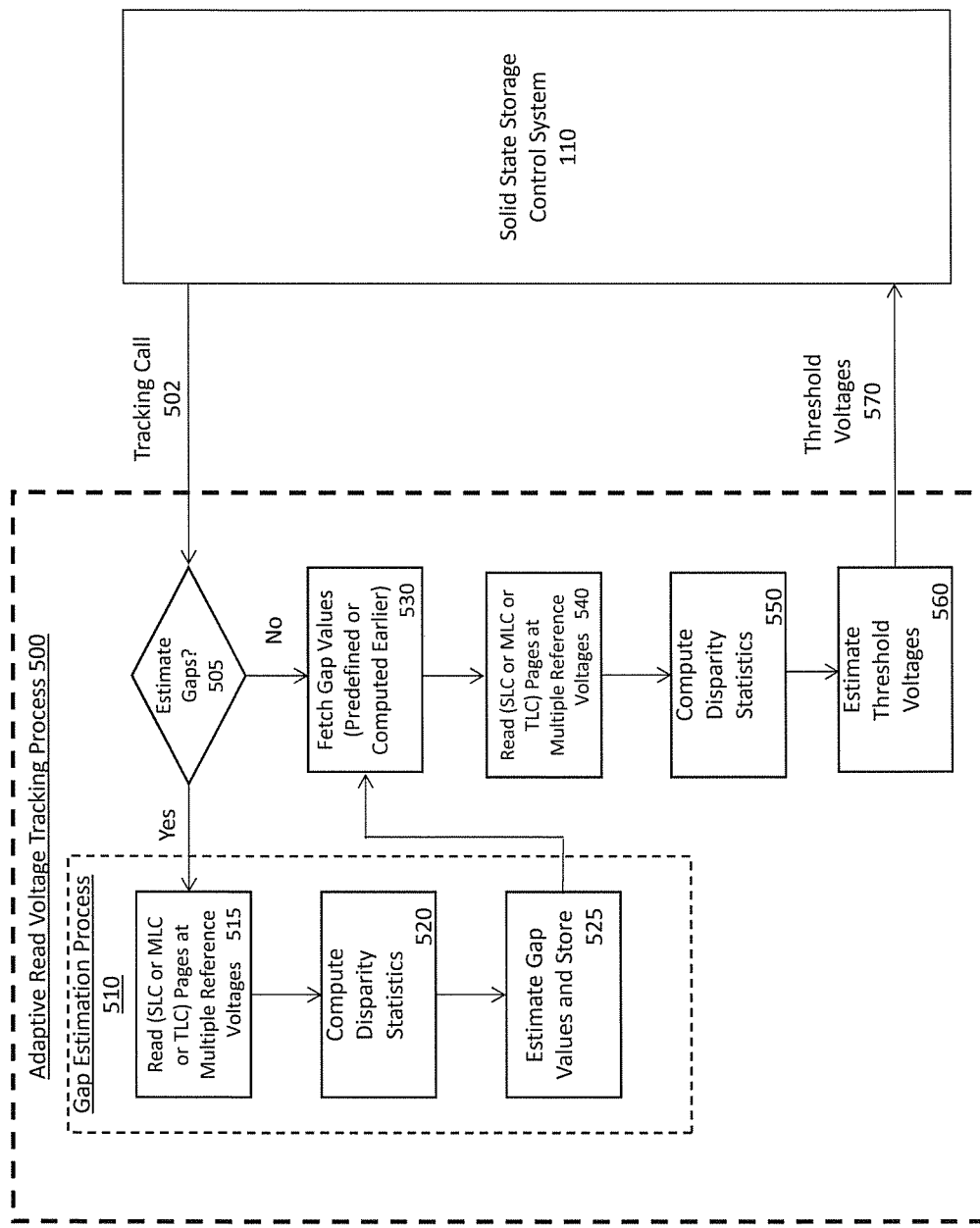

FIG. 5 is a flow chart illustrating an implementation of a read threshold voltage adjustment process 500 according to one embodiment of the invention. The read threshold voltage adjustment process 500 determines read threshold voltages using gap estimates.

As shown in FIG. 5, the read threshold voltage adjustment process 500 is initiated when a tracking call 502 is received from the solid state storage control system 110 of FIG. 1. The solid state storage control system 110 may be implemented, for example, in firmware and hardware.

A test is performed during step 505 to determine if the gaps G1 and G2 (FIG. 2) need to be estimated. As noted above, gaps can be obtained from the manufacturer of the solid state storage memory 160 (FIG. 1) or can be computed using equation (16) as the difference between the left and right mean values.

If it is determined during step 505 that the gaps need to be estimated, then a gap estimation process 510 reads pages (lower and upper pages) from the solid state storage memory 160 (such as an SLC, MLC or TLC memory) using multiple read threshold voltages (e.g., various offset locations) during step 515.

Disparity statistics are computed during step 520. As noted above, for lower pages, for example, disparity statistic are collected as follows in one embodiment. Select a page and read its lower page at a chosen offset value (e.g., R00=valid offset). Record the number of ones or disparity count of the page read. For the running example discussed above in conjunction with FIG. 2, the lower page is read at all 101 read threshold voltages/offsets and 101 corresponding disparity counts are recorded. Thereafter, disparity statistics are collected by reading the upper page, in a similar manner as the lower page.

The gap values are estimated (e.g., using equation (16)) and stored during step 525. Program control then proceeds to step 530.

If it is determined during step 505 that gaps do not need to be estimated, or the gaps have already been estimated using the gap estimation process 510, the gap values are obtained in step 530. Pages are read from the solid state storage memory 160 using multiple read threshold voltages (e.g., various offset locations) during step 540.

Disparity statistics are computed during step 550, in the manner described above for step 520. The read threshold voltages are then estimated during step 560, and provided to the solid state storage control system 110 of FIG. 1 during step 570. As noted above, once the distributions 210 (FIG. 2) are characterized in accordance with the techniques described herein, a given read threshold voltage R01, R00, R10 is obtained from the crossover point where the distributions for two adjacent levels 11, 01, 00, 10 cross.

Figure 6:
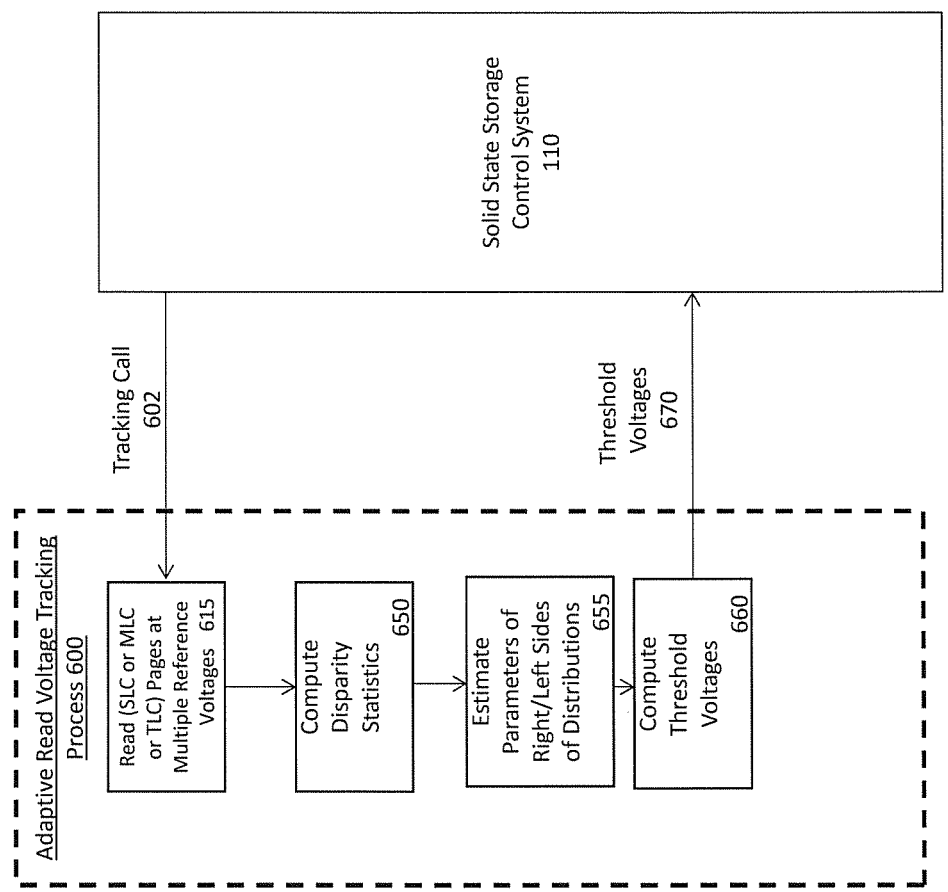

FIG. 6 is a flow chart illustrating an implementation of a read threshold voltage adjustment process 600 according to one embodiment of the invention. The read threshold voltage adjustment process 600 determines read threshold voltages without using gap estimates.

As shown in FIG. 6, the read threshold voltage adjustment process 600 is initiated when a tracking call 602 is received from the solid state storage control system 110 of FIG. 1. The read threshold voltage adjustment process 600 initially reads pages from the solid state storage memory 160 (such as an SLC, MLC or TLC memory) using multiple read threshold voltages (e.g., various offset locations) during step 615.

Disparity statistics are computed during step 650, in the manner described above for step 520 of FIG. 5. The parameters ($\mu^R$, $\sigma^R$, $\mu^L$, $\sigma^L$) of the right and left sides of the distributions 210 (FIG. 2) are estimated during step 655, as discussed above in conjunction with FIGS. 3 and 4. The read threshold voltages are then computed during step 660, and provided to the solid state storage control system 110 of FIG. 1 during step 670. As noted above, once the distributions 210 (FIG. 2) are characterized during step 655 in accordance with the techniques described herein, a given read threshold voltage R01, R00, R10 is obtained from the crossover point where the distributions for two adjacent levels 11, 01, 00, 10 cross.

Conclusion

The foregoing applications and associated embodiments should be considered as illustrative only, and numerous other embodiments can be configured using the read threshold voltage adjustment techniques disclosed herein.

According to one or more embodiments, the methods and processes described herein may be implemented in a controller as software, hardware, or any combination of the two.

For example, the methods and processes described herein may be stored in a memory as part of the firmware of a solid state storage device and may be executed by a processor for performing the methods and processes described herein. The methods and processes described herein may alternatively or additionally be stored in other computer-readable media accessible by the controller. In further embodiments, the methods and processes described herein may be implemented in a computing system external to and operably connected to the storage device, such as in a driver module of a host device connected to storage device through an interface, for example. The methods and processes described herein may further be stored in a memory or other computer-readable media accessible by the computing system and be executed by a processor of the computing system.

It should also be understood that the read threshold voltage adjustment techniques, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The disclosed read threshold voltage adjustment techniques may be implemented using one or more processing platforms. One or more of the processing modules or other components may therefore each run on a computer, storage device or other processing platform element. A given such element may be viewed as an example of what is more generally referred to herein as a "processing device."

Figure 7:
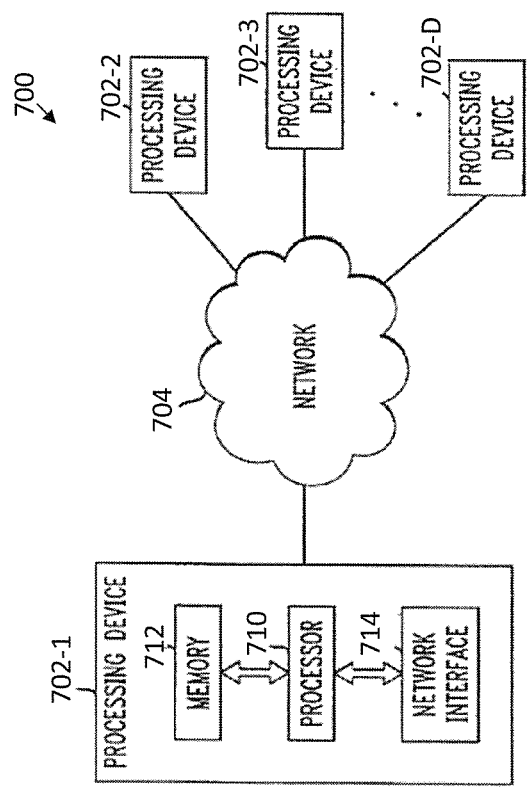
FIG. 7 illustrates a processing platform that may be used to implement at least a portion of one or more embodiments of the invention.

Referring now to FIG. 7, one possible processing platform that may be used to implement at least a portion of one or more embodiments of the invention is shown. The processing platform 700 in this embodiment comprises at least a portion of the given system and includes at least one processing device(s), denoted 702-1, 702-2, 702-3, . . . 702-D, which communicate with one another over a network 704. The network 704 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 702-1 in the processing platform 700 comprises a processor 710 coupled to a memory 712. The processor 710 may comprise a microprocessor, a microcontroller, an application specific integrated circuit (ASIC), a field programmable gate array (FPGA) or other type of processing circuitry, as well as portions or combinations of such circuitry elements, and the memory 712, which may be viewed as an example of a "computer program product" having executable computer program code embodied therein, may comprise random access memory (RAM), read only memory (ROM) or other types of memory, in any combination.

Also included in the processing device 702-1 is network interface circuitry 714, which is used to interface the processing device with the network 704 and other system components, and may comprise conventional transceivers.

The other processing devices 702, if any, of the processing platform 700 are assumed to be configured in a manner similar to that shown for processing device 702-1 in the figure.

Again, the particular processing platform 700 shown in the figure is presented by way of example only, and the given system may include additional or alternative processing platforms, as well as numerous distinct processing platforms in any combination, with each such platform comprising one or more computers, storage devices or other processing devices.

Multiple elements of the system may be collectively implemented on a common processing platform of the type shown in FIG. 7, or each such element may be implemented on a separate processing platform.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

It should again be emphasized that the above-described embodiments of the invention are presented for purposes of illustration only. Many variations and other alternative embodiments may be used. For example, the techniques are applicable to a variety of other types of solid state storage device that can benefit from the read threshold voltage adjustment processes disclosed herein. Also, the particular configuration of processing device elements shown herein, and the associated read threshold voltage adjustment techniques, can be varied in other embodiments. Moreover, the various simplifying assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. A device comprising:
a controller configured to adjust a read threshold voltage for reading a memory by performing the following steps, wherein the controller is distinct from the memory:
estimating a gap between two adjacent default read threshold voltages using binary data from the memory, wherein the gap is estimated using statistical characteristics of at least a first memory level of two adjacent memory levels of the memory, the statistical characteristics of the first memory level comprising a difference between at least two mean values for a statistical distribution of one or more of the two adjacent memory levels;
computing an adjusted read threshold voltage associated with the two adjacent memory levels by using the statistical characteristics of the two adjacent memory levels and the gap; and
updating the read threshold voltage with the adjusted read threshold voltage.

2. The device of claim 1, wherein the difference between the at least two mean values comprises a difference between a first mean value computed from a first side of the statistical distribution and a second mean value computed from a second side of the statistical distribution.

3. The device of claim 1, wherein the gap is further estimated using statistics from at least a first side of the statistical distribution of the first memory level, and wherein the estimated gap is used to estimate at least a first mean value and at least a first standard deviation value for the statistical distribution of the first memory level.

4. The device of claim 1, wherein the gap is estimated when a first mean value of the least two mean values is valid for only one side of the statistical distribution using at least one available valid observation for the other side of the statistical distribution.

5. The device of claim 4, wherein the controller is further configured to average a plurality of gap estimates when more than one available valid observation is available for the other side of the statistical distribution.

6. The device of claim 1, wherein the gap is estimated when a first mean value of the least two mean values is valid for only one side of the statistical distribution using a selected observation for the one side of the statistical distribution for the other side of the statistical distribution.

7. The device of claim 1, wherein the controller is further configured to read a plurality of pages of the memory at a plurality of read threshold offset locations to obtain disparity statistics of the memory; estimate the at least two mean values for the statistical distribution of the one or more of the two adjacent memory levels using the obtained disparity statistics; and estimate the gap between the two adjacent default read threshold voltages using the at least two mean values.

8. The device of claim 1, wherein the gap is further estimated by one or more of (i) using a voltage difference; (ii) using a number of offset steps between the two adjacent default read threshold voltages; (iii) using the difference between mean values of the two adjacent memory levels when statistics of the distribution of data values read from one or more cells are valid for both sides about at least one mean of the statistical distribution; (iv) when the mean value is valid for only one side of the statistical distribution, using one available valid observation for the other side of the statistical distribution; and (v) when the mean value is valid for only one side of the statistical distribution using a selected observation for the one side of the statistical distribution for the other side of the statistical distribution.

9. The device of claim 1, wherein the statistical characteristics of the two adjacent memory levels are characterized independently on two sides about at least one mean of the statistical distribution.

10. The device of claim 1, wherein the adjustment is performed responsive to one or more read errors.

11. A method for adjusting a read threshold voltage for reading a memory, comprising:
estimating a gap between two adjacent default read threshold voltages using binary data from the memory, wherein the gap is estimated using statistical characteristics of at least a first memory level of two adjacent memory levels of the memory, the statistical characteristics of the first memory level comprising a difference between at least two mean values for a statistical distribution of one or more of the two adjacent memory levels;
computing an adjusted read threshold voltage associated with the two adjacent memory levels by using the statistical characteristics of the two adjacent memory levels and the gap; and
updating the read threshold voltage with the adjusted read threshold voltage.

12. The method of claim 11, further comprising the steps of reading a plurality of pages of the memory at a plurality of read threshold offset locations to obtain disparity statistics of the memory; estimating the at least two mean values for the statistical distribution of the one or more of the two adjacent memory levels using the obtained disparity statistics; and estimating the gap between the two adjacent default read threshold voltages using the at least two mean values.

13. A non-transitory machine-readable recordable storage medium, wherein one or more software programs when executed by one or more processing devices implement the steps of the method of claim 11.

14. A controller apparatus for adjusting a read threshold voltage for reading a first memory, comprising:
a second memory; and
at least one processing device, coupled to the second memory, operative to implement the following steps:
estimating a gap between two adjacent default read threshold voltages using binary data from the first memory, wherein the gap is estimated using statistical characteristics of at least a first memory level of two adjacent memory levels of the first memory, the statistical characteristics of the first memory level comprising a difference between at least two mean values for a statistical distribution of one or more of the two adjacent memory levels;

computing an adjusted read threshold voltage associated with the two adjacent memory levels by using the statistical characteristics of the two adjacent memory levels and the gap; and updating the read threshold voltage with the adjusted read threshold voltage.

15. The controller of claim 14, further comprising the steps of reading a plurality of pages of the first memory at a plurality of read threshold offset locations to obtain disparity statistics of the first memory; estimating the at least two mean values for the statistical distribution of the one or more of the two adjacent memory levels using the obtained disparity statistics; and estimating the gap between the two adjacent default read threshold voltages using the at least two mean values.

* * * * *